United States Patent
Hayami et al.

(10) Patent No.: US 10,490,622 B2
(45) Date of Patent: Nov. 26, 2019

(54) SEMICONDUCTOR CAPACITOR

(71) Applicant: Nissan Motor Co., Ltd., Yokohama-shi, Kanagawa (JP)

(72) Inventors: Yasuaki Hayami, Kanagawa (JP); Tetsuya Hayashi, Atsugi (JP); Yusuke Zushi, Kanagawa (JP); Wei Ni, Kanagawa (JP); Akinori Okubo, Kanagawa (JP)

(73) Assignee: Nissan Motor Co., Ltd., Yokohama (JP)

( * ) Notice: Subject to any disclaimer, the term of this patent is extended or adjusted under 35 U.S.C. 154(b) by 0 days.

(21) Appl. No.: 16/318,734

(22) PCT Filed: Aug. 5, 2016

(86) PCT No.: PCT/JP2016/073116
§ 371 (c)(1),
(2) Date: Jan. 18, 2019

(87) PCT Pub. No.: WO2018/025403
PCT Pub. Date: Feb. 8, 2018

(65) Prior Publication Data
US 2019/0288058 A1    Sep. 19, 2019

(51) Int. Cl.
*H01L 21/00*    (2006.01)
*H01L 49/02*    (2006.01)

(52) U.S. Cl.
CPC .............. *H01L 28/60* (2013.01); *H01L 28/40* (2013.01)

(58) Field of Classification Search
CPC .................................................... H01L 28/60
See application file for complete search history.

(56) References Cited

U.S. PATENT DOCUMENTS

| | | | | |
|---|---|---|---|---|
| 6,124,821 | A * | 9/2000 | Pezzini | H03M 1/0648 341/133 |
| 7,944,732 | B2 * | 5/2011 | de Jong | H01L 23/5223 257/208 |
| 8,766,403 | B2 * | 7/2014 | Huang | H01L 23/5223 257/296 |
| 9,406,671 | B2 * | 8/2016 | Huang | H01L 23/5223 |
| 10,304,633 | B2 | 5/2019 | Okada et al. | |
| 2002/0130388 | A1 | 9/2002 | Stamper | |
| 2005/0017321 | A1* | 1/2005 | Hakkarainen | H01L 27/0805 257/532 |
| 2009/0160019 | A1 | 6/2009 | Yang | |

(Continued)

FOREIGN PATENT DOCUMENTS

| | | |
|---|---|---|
| CN | 103930961 A | 7/2014 |
| JP | S63-284851 A | 11/1988 |

(Continued)

*Primary Examiner* — Nicholas J Tobergte
(74) *Attorney, Agent, or Firm* — Global IP Counselors, LLP

(57) ABSTRACT

A semiconductor capacitor includes a semiconductor substrate, an electrode group formed on the semiconductor substrate, and a plurality of insulators sandwiched between the electrode groups to form a plurality of capacitors. At least one of the plurality of capacitors is set to be different from at least one of a tolerance, which is a capability of the capacitors to withstand a prescribed voltage, and a conductance, which is an ease with which a leakage current flows in the capacitors.

15 Claims, 9 Drawing Sheets

(56) References Cited

U.S. PATENT DOCUMENTS

| | | | |
|---|---|---|---|
| 2009/0256239 A1 | 10/2009 | Pompl | |
| 2013/0200489 A1* | 8/2013 | Huang | H01L 23/5223 257/532 |
| 2014/0291806 A1* | 10/2014 | Huang | H01L 23/5223 257/532 |
| 2014/0374880 A1 | 12/2014 | Chen et al. | |
| 2016/0020268 A1 | 1/2016 | Suwada | |

FOREIGN PATENT DOCUMENTS

| | | |
|---|---|---|
| JP | 8-316413 A | 11/1996 |
| JP | 2006-54403 A | 2/2006 |
| JP | 2007-173606 A | 7/2007 |
| JP | 2009-59990 A | 3/2009 |
| JP | 2009-290179 A | 12/2009 |
| JP | 2011-199191 A | 10/2011 |
| JP | 2013-168633 A | 8/2013 |
| JP | 2014-67853 A | 4/2014 |
| JP | 2016-25103 A | 2/2016 |

* cited by examiner

SEMICONDUCTOR CAPACITOR

CROSS-REFERENCE TO RELATED APPLICATIONS

This application is a U.S. national stage application of International Application No. PCT/JP2016/073116, filed on Aug. 5, 2016.

BACKGROUND

Technical Field

The present invention relates to a semiconductor capacitor having a structure in which insulators are sandwiched between each electrode of an electrode group.

Background Information

A capacitor that utilizes semiconductors is known from the prior art. In such a capacitor, trench electrodes are formed on one main surface of a semiconductor substrate. In a process for forming the capacitor, first, trenches are formed on the one main surface of the semiconductor substrate. An oxide film, which serves as an insulating film, is then formed in the trenches. Next, trench electrodes, which are obtained by filling the trenches with electrode material, are formed on the surface of the semiconductor substrate. An oxide film serving as a dielectric is then formed between adjacent trench electrodes. The capacitor manufactured by means of this process has a lateral capacitor structure between the trench electrodes (for example, see Japanese Patent No. 5270124 (Japanese Laid-Open Patent Publication No. 2009-059990) refer to Patent Document 1).

SUMMARY

Capacitors that utilize semiconductors have different characteristics, such as withstand voltage, conductance, etc., which depend on the requirements thereof. The capacitor characteristics must therefore be changed as requirements change. However, in a conventional semiconductor capacitor, a plurality of capacitors with the same characteristics are provided on the semiconductor substrate. Thus, the conventional semiconductor capacitor has the problem that it is not possible to meet the various requirements with a circuit formed from the semiconductor substrate.

In view of the problem described above, an object of the present invention is to provide a semiconductor capacitor that is able to meet the various requirements with a circuit formed from the semiconductor substrate.

In order to realize the object described above, the present invention is provided with a semiconductor substrate, an electrode group that is formed on the semiconductor substrate, and insulators in which a plurality of capacitors are formed. The plurality of capacitors has a structure in which insulators are sandwiched between each electrode in the electrode group. At least one of the plurality of capacitors is set to be different in at least one of a tolerance, which is a capability of the capacitors to withstand a prescribed voltage, and a conductance, which is an ease with which a leakage current flows in the capacitors.

As a result, it is possible to provide a semiconductor capacitor that is able to meet the various requirements with a circuit formed from a semiconductor substrate.

DETAILED DESCRIPTION OF THE EMBODIMENTS

Figure 1:
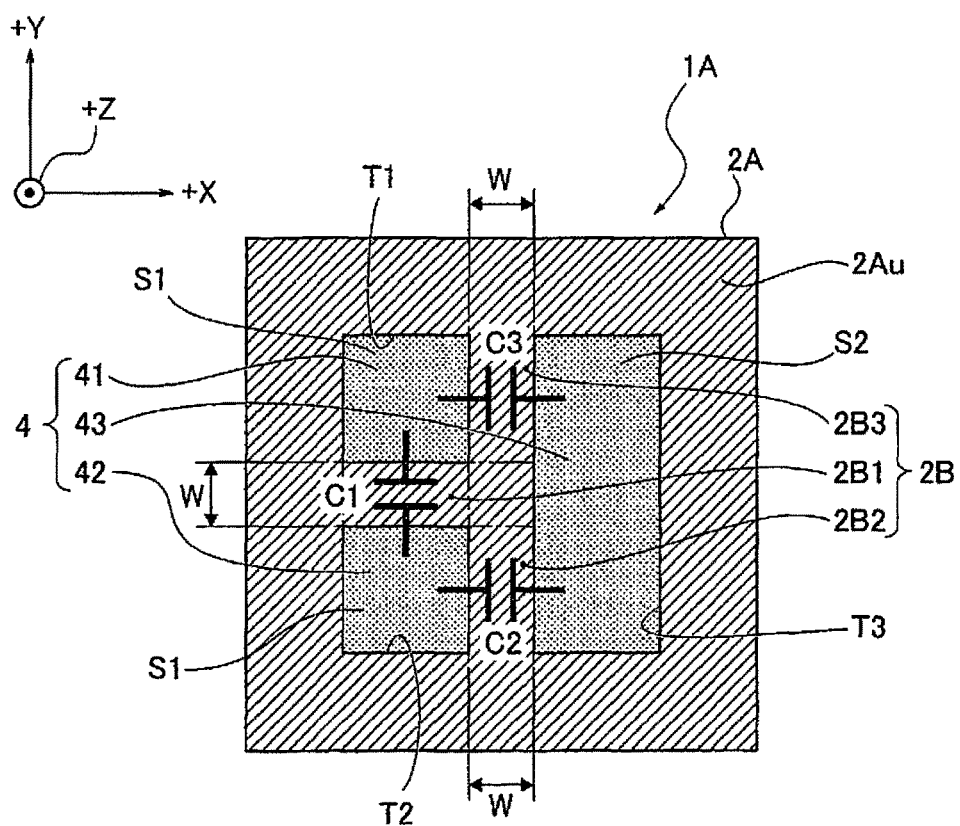
FIG. 1 is a plan view illustrating a planar structure of a semiconductor capacitor in a first embodiment.

Preferred embodiments for realizing a semiconductor capacitor according to the present invention will be described below with reference to Embodiments 1 to 6 illustrated in the drawings.

First Embodiment

Figure 2:
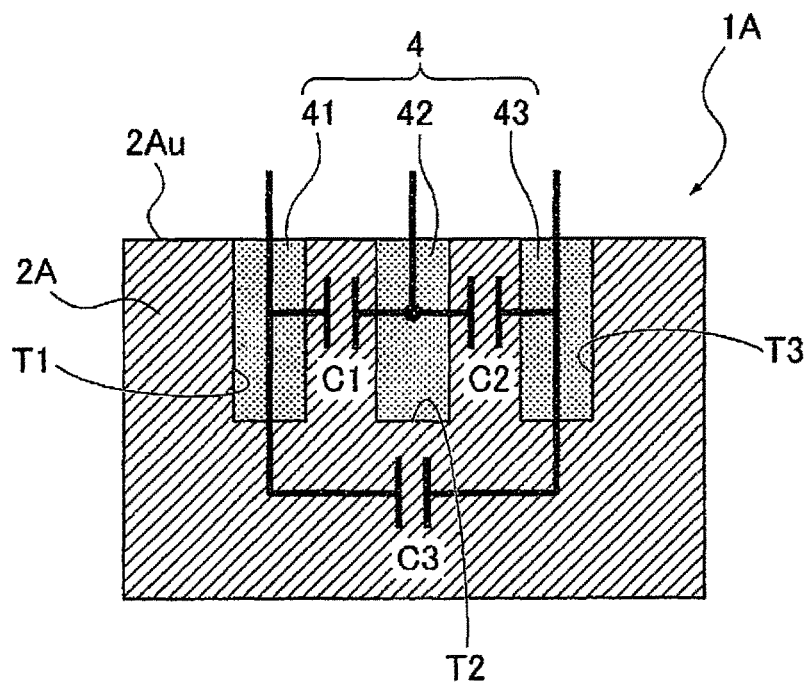
FIG. 2 is an explanatory expanded view illustrating an internal structure of the semiconductor capacitor in the first embodiment.

First, the configuration is described. The semiconductor capacitor according to the first embodiment is applied to a semiconductor capacitor in which a plurality of lateral capacitors is formed. FIG. 1 shows a planar structure of the semiconductor capacitor according to the first embodiment, and FIG. 2 shows an internal structure. An "overall configuration" and an "arrangement configuration" will be described separately below regarding the configuration of the semiconductor capacitor according to the first embodiment based on FIGS. 1 and 2. For the sake of convenience of the explanation, the positional relationship between each member will be described below with reference to an XYZ orthogonal coordinate system. Specifically, the width direction (+X direction) of the semiconductor capacitor is defined as the X-axis direction. The front-rear direction (+Y direction) of the semiconductor capacitor, which is orthogonal to the X-axis direction, is defined as the Y-axis direction, and the height direction (+Z direction) of the semiconductor capacitor, which is orthogonal to the X-axis direction and the Y-axis direction, is defined as the Z-axis direction. Where appropriate, the +X direction is referred to as rightward (−X direction is referred to as leftward), the +Y direction is referred to as forward (−Y direction is referred to as rearward), and the +Z direction is referred to as upward (−Z direction is referred to as downward). Here, "lateral capacitor" refers to a capacitor having a configuration in which a terminal electrode is provided on one surface (for example, the upper surface) of the substrate.

Overall Configuration

A semiconductor capacitor 1A comprises a semiconductor substrate 2A (for example, silicon oxide), insulators 2B (for example, silicon oxide), and an electrode group 4 (for example, polycrystalline silicon), as shown in FIG. 1. The semiconductor capacitor 1A is fabricated by carrying out a trench forming process, an insulating film forming process, and an electrode group forming process, in that order. In the insulating film forming process, a substrate material (for example, silicon) is oxidized. The chain double-dashed line in FIG. 1 represents the boundaries between the semiconductor substrate 2A and the insulators 2B.

A first trench T1 (groove), a second trench T2 (groove), and a third trench T3 (groove) are formed on an upper surface 2Au (front surface) of the semiconductor substrate 2A, as shown in FIG. 1. A first unit electrode 41 is formed in the first trench T1, as shown in FIG. 1. A second unit electrode 42 is formed in the second trench T2, as shown in FIG. 1. A third unit electrode 43 is formed in the third trench T3, as shown in FIG. 1.

The insulators 2B include a first insulator 2B1, a second insulator 2B2, and a third insulator 2B3, as shown in FIG. 1. The first insulator 2B1 is sandwiched between the first unit electrode 41 and the second unit electrode 42, as shown in FIG. 1. The first insulator 2B1 serves as the dielectric of a first capacitor C1, as shown in FIG. 1. The second insulator 2B2 is sandwiched between the second unit electrode 42 and the third unit electrode 43, as shown in FIG. 1. The second insulator 2B2 serves as the dielectric of a second capacitor C2, as shown in FIG. 1. The third insulator 2B3 is sandwiched between the first unit electrode 41 and the third unit electrode 43, as shown in FIG. 1. The third insulator 2B3 serves as the dielectric of a third capacitor C3, as shown in FIG. 1. The tolerance and/or the conductance is set to differ among the first capacitor C1, the second capacitor C2, and the third capacitor C3, shown in FIG. 1.

Here, "tolerance" refers to a capability of the capacitor to withstand a prescribed voltage, and includes the concepts of withstand voltage and insulation resistance. "Withstand voltage" refers to the voltage that can be applied for a specified period of time without causing dielectric breakdown of the capacitor and is proportional to the thickness of the insulator that serves as the dielectric. "Insulation resistance" refers to the electric resistance value between insulated circuits or conductors. "Conductance" refers to the ease with which leakage current flows in the capacitor and is proportional to the surface area, etc., of the unit electrodes that constitute the electrode group.

The electrode group 4 comprises the first unit electrode 41, the second unit electrode 42, and the third unit electrode 43, as shown in FIG. 1. The first unit electrode 41 has the structure of a trench electrode that is embedded in the first trench T1, as shown in FIG. 2. The second unit electrode 42 has the structure of a trench electrode that is embedded in the second trench T2, as shown in FIG. 2. The third unit electrode 43 has the structure of a trench electrode that is embedded in the third trench T3, as shown in FIG. 2.

Arrangement Configuration

The first capacitor C1 is arranged between the first unit electrode 41 and the second unit electrode 42, as shown in FIGS. 1 and 2. The second capacitor C2 is arranged between the second unit electrode 42 and the third unit electrode 43, as shown in FIGS. 1 and 2. The third capacitor C3 is arranged between the first unit electrode 41 and the third unit electrode 43, as shown in FIGS. 1 and 2.

The thicknesses of the first insulator 2B1, the second insulator 2B2, and the third insulator 2B3 are W, as shown in FIG. 1. The thickness W of the first insulator 2B1, shown in FIG. 1, is proportional to the withstand voltage of the first capacitor C1. The thickness W of the second insulator 2B2, shown in FIG. 1, is proportional to the withstand voltage of the second capacitor C2. The thickness W of the third insulator 2B3, shown in FIG. 1, is proportional to the withstand voltage of the third capacitor C3. The thicknesses of the first insulator 2B1, the second insulator 2B2, and the third insulator 2B3 are the same W. That is, the voltage that can be applied to the first capacitor C1, the second capacitor C2, and the third capacitor C3 for a specified time without causing dielectric breakdown is the same. The surface area of the first unit electrode 41 is S1, as shown in FIG. 1. The surface area of the second unit electrode 42 is S1, as shown in FIG. 1. That is, the surface area S1 of the first unit electrode 41 is equal to the surface area S1 of the second unit electrode 42, as shown in FIG. 1. The surface area of the third unit electrode 43 is S2, as shown in FIG. 1. The surface area S1 of the first unit electrode 41 and the second unit electrode 42 is less than the surface area S2 of the third unit electrode 43 (S1<S2), as shown in FIG. 1. The surface area S1 of the first unit electrode 41, shown in FIG. 1, is proportional to the conductance of the first capacitor C1. The surface area S2 of the second unit electrode 42, shown in FIG. 1, is proportional to the conductance of the second capacitor C2. The surface area S3 of the third unit electrode 43, shown in FIG. 1, is proportional to the conductance of the third capacitor C3. That is, the structure of the third capacitor C3, shown in FIG. 1, is such that leakage current flows more easily compared to the first capacitor C1 and the second capacitor C2.

The actions will now be described. For example, as a capacitor of the prior art that utilizes a semiconductor, a capacitor having the structure of a lateral semiconductor capacitor between trench electrodes is known. In the method for manufacturing this semiconductor capacitor, trenches are formed on one main surface of a semiconductor substrate. Next, an oxide film serving as an insulating film is formed inside the trenches. Next, electrodes formed by filling the trenches with electrode material are formed on the surface of the semiconductor substrate. Next, an oxide film serving as a dielectric is formed between adjacent trench electrodes.

For example, as a capacitor of the prior art that utilizes a semiconductor, a capacitor having a two-terminal structure is known. In this semiconductor capacitor, a plurality of capacitors is connected in parallel by means of adjacent trench electrodes formed on the semiconductor substrate and insulating film sandwiched therebetween.

In general, there is a demand for semiconductor capacitors with increased ability to withstand a prescribed voltage or to suppress the leakage current that flows therein. Characteristics such as the capacitance of the capacitor differ depending on these demands.

However, in a conventional semiconductor capacitor, the plurality of the capacitors formed on the semiconductor substrate have the same capacitance. In addition, the region of the semiconductor substrate acts only as a support member and does not serve a specific electrical function. Thus, in the conventional semiconductor capacitor, a structure in which a plurality of capacitors is connected in a net-like fashion, such as a three-terminal capacitor, is not assumed. Thus, there is the problem that it is not possible to meet the various requirements with a circuit formed from the semiconductor substrate.

In contrast, in the first embodiment, the tolerance, which is a capability of the capacitor to withstand a prescribed voltage, and/or the conductance, which is the ease with which leakage current flows in the capacitor, is set to differ among the first capacitor C1, the second capacitor C2, and the third capacitor C3. That is, the first capacitor C1, the second capacitor C2, and the third capacitor C3, having different tolerances and/or different conductances, are provided on the semiconductor substrate 2A. Thus, the voltage that can be applied for a specified period of time without causing dielectric breakdown or the ease with which leakage current flows is different for each of the first capacitor C1, the second capacitor C2, and the third capacitor C3. As a result, it is possible to selectively use the first capacitor C1, the second capacitor C2, and the third capacitor C3, according to the requirements demanded of the semiconductor capacitor 1A. As a result, it is possible to meet various requirements with the capacitor circuit formed from the semiconductor substrate 2.

In addition, the semiconductor capacitor 1A comprises the semiconductor substrate 2A and the electrode group 4 that is formed on the semiconductor substrate 2A, having a structure in which the insulators 2B are sandwiched between each of the electrodes in the electrode group 4. Thus, the areas between the first unit electrode 41, the second unit electrode 42, and the third unit electrode 43 become the connection points between the first capacitor C1, the second capacitor C2, and the third capacitor C3. As a result, the semiconductor capacitor 1A becomes a three-terminal capacitor. That is, it is possible to increase the number of terminals of the semiconductor capacitor 1A to three terminals, which is more than the conventional two terminals. Therefore, it is possible to form the capacitor circuit that connects the first capacitor C1, the second capacitor C2, and the third capacitor C3 on the semiconductor substrate, which contributes to downsizing, and weight and cost reduction of capacitor components.

In the first embodiment, the first unit electrode 41, the second unit electrode 42, and the third unit electrode 43, which constitute the electrode group 4, have the structures of trench electrodes that are embedded in the first trench T1, the second trench T2, and the third trench T3, formed on the upper surface 2Au of the semiconductor substrate 2A. That is, the first unit electrode 41, the second unit electrode 42, and the third unit electrode 43, which are trench-shaped and adjacent to each other, are formed on the upper surface 2Au of the semiconductor substrate 2A. Thus, it is possible to form the first capacitor C1, the second capacitor C2, and the third capacitor C3 between the adjacent trench-shaped first unit electrode 41, the second unit electrode 42, and the third unit electrode 43. As a result, it is possible to make the first trench T1, the second trench T2, and the third trench T3 deep, and to make the trench structure fine. Thus, it is possible to increase the electrostatic capacitance of the first capacitor C1, the second capacitor C2, and the third capacitor C3, compared to the prior art.

In the first embodiment, the width W between the first unit electrode 41, the second unit electrode 42, and the third unit electrode 43 is proportional to the withstand voltage of the first capacitor C1, the second capacitor C2, and the third capacitor C3. That is, the withstand voltage of the first capacitor C1, the second capacitor C2, and the third capacitor C3 increases in proportion to the thickness W of the first unit electrode 41, the second unit electrode 42, and the third unit electrode 43. Thus, the withstand voltage of the first capacitor C1, the second capacitor C2, and the third capacitor C3 increases in proportion to the width W of the first insulator 2B1, the second insulator 2B2, and the third insulator 2B3. Thus, it is possible to set the thickness of the first trench T1, the second trench T2, and the third trench T3 in order to realize the necessary withstand voltage of the first capacitor C1, the second capacitor C2, and the third capacitor C3. Thus, it is possible to control the withstand voltage required by the first capacitor C1, the second capacitor C2, and the third capacitor C3 by means of the thickness of the first trench T1, the second trench T2, and the third trench T3.

The effects are described next. The effects listed below can be obtained according to the semiconductor capacitor 1A of the first embodiment.

(1) A semiconductor capacitor (semiconductor capacitor 1A), in which are formed a plurality of capacitors (the first capacitor C1, the second capacitor C2, and the third capacitor C3), comprising a semiconductor substrate (semiconductor substrate 2A), an electrode group (electrode group 4) that is formed on the semiconductor substrate (semiconductor substrate 2A), and insulators (insulators 2B), having a structure in which the insulators 2B (insulators 2B) are sandwiched between each of the electrode in the group (electrode group 4) wherein the tolerance, which is a capability of the capacitor to withstand a prescribed voltage, and/or the conductance, which is the ease with which leakage current flows in the capacitor, is set to differ among the plurality of capacitors (the first capacitor C1, the second capacitor C2, and the third capacitor C3) (FIGS. 1 and 2). As a result, it is possible to provide a semiconductor capacitor (the semiconductor capacitor 1A) that is able to meet various requirements with the circuit (the first capacitor C1, the second capacitor C2, and the third capacitor C3) formed from the semiconductor substrate 2.

(2) The unit electrodes (the first unit electrode 41, the second unit electrode 42, and the third unit electrode 43), which constitute the electrode group (the electrode group 4), have the structures of trench electrodes that are embedded in grooves (the first trench T1, the second trench T2, and the third trench T3), formed on a surface (the upper surface 2Au) of the semiconductor substrate (the semiconductor substrate 2A). Thus, in addition to the effect of (1), it is possible to increase the electrostatic capacitance of the capacitors (the first capacitor C1, the second capacitor C2, and the third capacitor C3), compared to the prior art.

(3) The width between the unit electrodes (the first unit electrode 41, the second unit electrode 42, and the third unit electrode 43) is proportional to the withstand voltage of the capacitors (the first capacitor C1, the second capacitor C2, and the third capacitor C3) that are formed between the unit electrodes (the first unit electrode 41, the second unit electrode 42, and the third unit electrode 43) (FIG. 1). Thus, in addition to the effect of (1) or (2), it is possible to control the withstand voltage required by the capacitors (the first capacitor C1, the second capacitor C2, and the third capacitor C3) by the thickness between the grooves (the first trench T1, the second trench T2, and the third trench T3).

Second Embodiment

The second embodiment is an example in which one of the unit electrodes of the electrode group is configured as the semiconductor substrate.

The configuration is described first. The semiconductor capacitor according to the second embodiment is applied to an XY capacitor. The "overall configuration," the "arrangement configuration," the "circuit configuration," and the "semiconductor capacitor manufacturing method" will be described separately below regarding the configuration of the semiconductor capacitor according to the second embodiment. Here, an "XY capacitor" is configured from a combination of an X capacitor and a Y capacitor and is used for suppressing electromagnetic noise. "Electromagnetic noise" can be divided into two types of noise depending on the method (mode) of conduction, normal mode noise and common mode noise. "Normal mode noise" refers to the electromagnetic noise that is generated between power supply lines. "Common mode noise" refers to the electromagnetic noise that is generated between a power supply line and chassis ground. "Chassis ground" is connected to ground, and is provided by the semiconductor substrate, for example.

Figure 3:
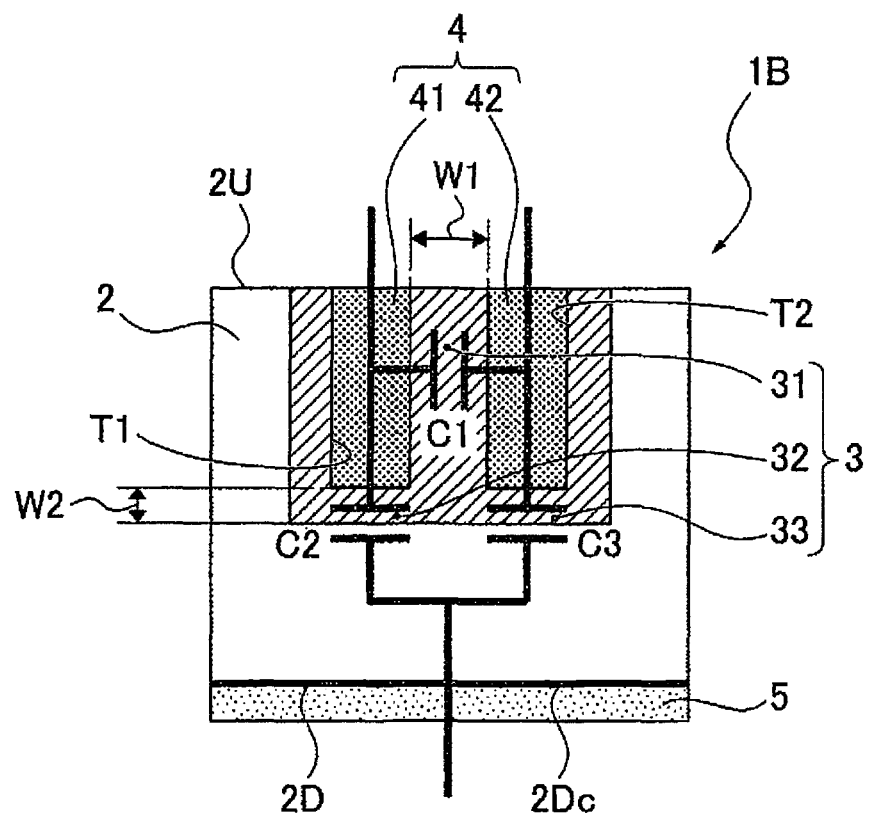
FIG. 3 is an explanatory expanded view illustrating an internal structure of the semiconductor capacitor in a second embodiment.

FIG. 3 illustrates the internal structure of the semiconductor capacitor in the second embodiment. The overall configuration of the semiconductor capacitor of the second embodiment will be described below with reference to FIG. 3.

A semiconductor capacitor 1B comprises a semiconductor substrate 2 (for example, silicon), the insulators 3 (for example, silicon oxide), an electrode group 4 (for example, polycrystalline silicon), and a terminal electrode 5 (for example, aluminum).

The semiconductor substrate 2 serves as one of the unit electrodes of the electrode group. A first trench T1 (groove) and a second trench T2 (groove) are formed on an upper surface 2U (front surface) of the semiconductor substrate 2. The first unit electrode 41 is formed in the first trench T1. The second unit electrode 42 is formed in the second trench T2. A contact region 2Dc for realizing electrical conduction with the semiconductor substrate 2 is formed on a lower surface 2D of the semiconductor substrate 2, which differs from the upper surface 2U on which the first unit electrode 41 and the second unit electrode 42 are formed. In FIG. 3, the contact region 2Dc is indicated by a bold line. Here, the "contact region" refers to a portion where the terminal electrode 5 and the semiconductor substrate 2 are connected.

The insulators 3 include a first insulator 31, a second insulator 32, and a third insulator 33. The first insulator 31 is sandwiched between the first unit electrode 41 and the second unit electrode 42. The first insulator 31 serves as the dielectric of the first capacitor C1. The second insulator 32 is sandwiched between the first unit electrode 41 and the semiconductor substrate 2. The second insulator 32 serves as the dielectric of the second capacitor C2. The third insulator 33 is sandwiched between the second unit electrode 42 and the semiconductor substrate 2. The third insulator 33 serves as the dielectric of the third capacitor C3. The tolerance and/or the conductance is set to differ among the first capacitor C1, the second capacitor C2, and the third capacitor C3.

The electrode group 4 comprises the first unit electrode 41 and the second unit electrode 42. The first unit electrode 41 has the structure of a trench electrode that is embedded in the first trench T1. The second unit electrode 42 has the structure of a trench electrode that is embedded in the second trench T2.

The terminal electrode 5 is formed on the lower surface 2D of the semiconductor substrate 2.

The arrangement configuration will be described below with reference to FIG. 3.

The first capacitor C1 is arranged between the first unit electrode 41 and the second unit electrode 42. The second capacitor C2 is arranged between the first unit electrode 41 and the semiconductor substrate 2. The third capacitor C3 is arranged between the second unit electrode 42 and the semiconductor substrate 2.

The thickness of the first insulator 31 is W1. The thickness of the second insulator 32 is W2. The thickness of the third insulator 33 is W2. The thickness W2 of the second insulator 32 is the same as the thickness W2 of the third insulator 33. The thickness W1 of the first insulator 31 is greater than the thickness W2 of the second insulator 32 and the third insulator 33 (W2<W1). The thickness W1 of the first insulator 31 is proportional to the withstand voltage of the first capacitor C1. The thickness W2 of the second insulator 32 is proportional to the withstand voltage of the second capacitor C2. The thickness W3 of the third insulator 33 is proportional to the withstand voltage of the third capacitor C3. That is, the voltage that can be applied for a specified period of time without causing dielectric breakdown is greater for the first capacitor C1 compared to that for the second capacitor C2 and the third capacitor C3.

Figure 4:
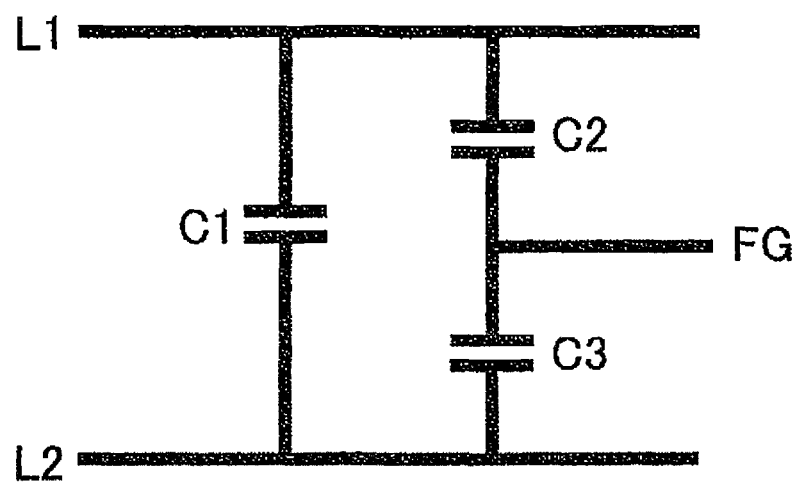
FIG. 4 is an equivalent circuit diagram illustrating a circuit configuration of the semiconductor capacitor in the second embodiment.

FIG. 4 illustrates the circuit configuration of the semiconductor capacitor of the second embodiment. The circuit configuration will be described below with reference to FIG. 4. The semiconductor capacitor of the first embodiment comprises an X capacitor, but the semiconductor capacitor of the second embodiment comprises an X capacitor and a Y capacitor.

The first capacitor C1 functions as the X capacitor that suppresses normal mode noise. The first capacitor C1 is connected to power supply lines L1, L2. The second capacitor C2 and the third capacitor C3 function as the Y capacitor that suppresses common mode noise. The second capacitor C2 is connected to the power supply line L1 and a chassis ground FG. The third capacitor C3 is connected to the power supply line L2 and the chassis ground FG. Here, the "X capacitor" is a capacitor that is connected between the power supply lines, preferably having a large electrostatic capacitance in order to increase effects such as suppressing the voltage fluctuation of the power supply lines. The "Y capacitor" has a configuration in which the capacitor is connected between each power supply line and the chassis ground and is used for suppressing common mode noise. Since the "Y capacitor" is connected between each power supply line and the chassis ground, it is necessary for the leakage current to be safely suppressed.

FIGS. 5 to 8 illustrate the method for manufacturing the semiconductor capacitor according to the second embodiment. The method for manufacturing the semiconductor capacitor according to the second embodiment will be described below with reference to FIGS. 5 to 8. In the second embodiment, the semiconductor capacitor 1B is manufactured by carrying out the trench forming process (FIGS. 5 and 6), the insulating film forming process (FIG. 7), and the electrode group forming process (FIG. 8), in that order.

Figure 5:
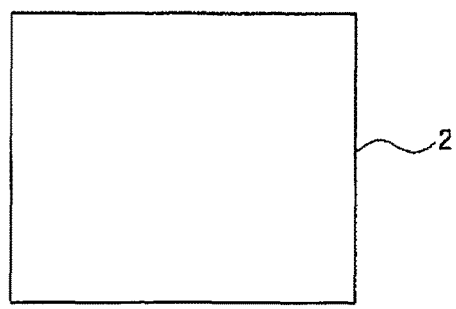
FIG. 5 is a cross-sectional view illustrating a trench forming process of a method for manufacturing a semiconductor capacitor in the second embodiment.
Figure 6:
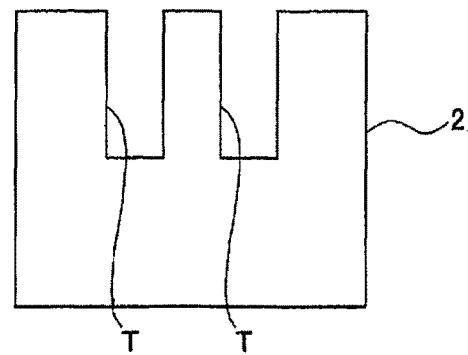
FIG. 6 is a cross-sectional view illustrating a trench forming process of the method for manufacturing the semiconductor capacitor in the second embodiment.

In the trench forming process, first, the semiconductor substrate 2 is prepared, as shown in FIG. 5. Next, there is an oxide film deposition step for depositing an oxide film on the semiconductor substrate 2 by means of the CVD method, but an illustration thereof is omitted. Next, there is a resist coating step for coating a resist on the oxide film, but an illustration thereof is omitted. Next, there is an exposure step for exposing the resist through a mask, but an illustration thereof is omitted. Next, there is an exposure portion removal step for removing the exposed portion of the resist, but an illustration thereof is omitted. Next, there is an oxide film etching step for etching the oxide film, but an illustration thereof is omitted. Next, there is a resist peeling step for peeling the resist from the oxide film, but an illustration thereof is omitted. Next, two trenches T are formed by anisotropic etching, using the oxide film (not shown), from which the resist has been peeled in the resist peeling step, as a mask, as shown in FIG. 6. Next, there is an oxide film removal step for removing the oxide film (not shown), from which the resist has been peeled in the resist peeling step, but an illustration thereof is omitted. The trench forming process is thereby completed.

Figure 7:
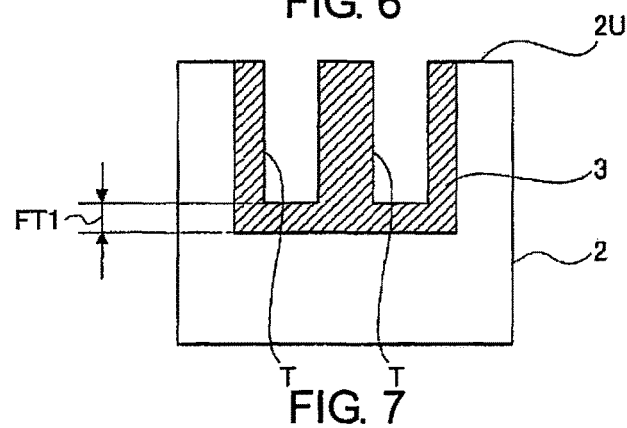
FIG. 7 is a cross-sectional view illustrating an insulating film forming process of the method for manufacturing the semiconductor capacitor in the second embodiment.

In the insulator forming process, first, there is a thermal oxidation step in which the semiconductor substrate 2 that is cleaned in a substrate cleaning step is placed in an oxidation furnace and imparted with heat in oxygen, but an illustration thereof is omitted. The insulator 3 is formed on the semiconductor substrate 2 in this thermal oxidation step. Next, the upper surface 2U of the semiconductor substrate 2 is exposed by means of an insulator removal step in which portions of the insulator 3 are removed, as shown in FIG. 7. The insulator forming process is thereby completed. The oxide film thickness FT1 in FIG. 7 indicates the oxide film thickness of the insulator 3 that is formed at the bottom of the trenches T.

Figure 8:
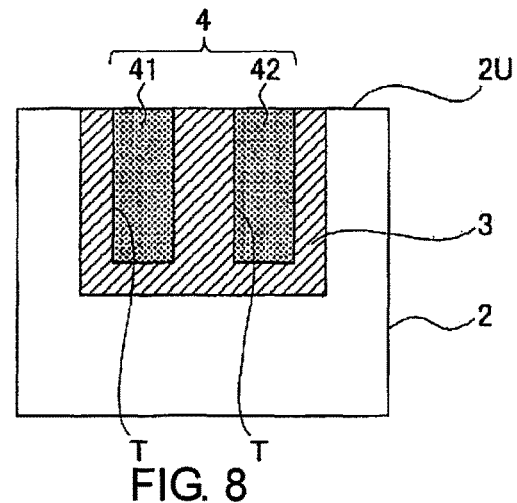
FIG. 8 is a cross-sectional view illustrating an electrode group forming process of the method for manufacturing the semiconductor capacitor in the second embodiment.

In the electrode group forming process, first, there is an electrode material deposition step in which an electrode material is deposited on the upper surface 2U of the semiconductor substrate 2, from which portions of the insulator 3 have been removed in the insulator removal step, using the CVD method, but an illustration thereof is omitted. The two trenches T are filled with the electrode material by means of this electrode material deposition step. The first unit electrode 41 and the second unit electrode 42 are thereby formed in the trenches T, as shown in FIG. 8. Next, the upper surface 2U of the semiconductor substrate 2 is exposed by means of an electrode material removal step in which portions of the electrode material are removed, as shown in FIG. 8. The electrode group forming process is thereby completed.

The actions are described next. In the second embodiment, one of the unit electrodes of the electrode group is the semiconductor substrate 2. That is, the semiconductor substrate 2 serves as one of the unit electrodes. Thus, the semiconductor substrate 2 is used as one electrode of the second capacitor C2 and the third capacitor C3. In particular, when the semiconductor substrate 2 is a substrate having a relatively low resistance, the capacitor circuit can be configured with the semiconductor substrate 2 serving as a connection point. As a result, the second capacitor C2 can be formed between the first unit electrode 41 and the semiconductor substrate 2, in addition to which the third capacitor C3 can be formed between the second unit electrode 42 and the semiconductor substrate 2. Therefore, it is possible to cause the areas between the semiconductor substrate 2 and the first unit electrode 41 as well as the second unit electrode 42 to function as capacitors, in addition to the area between the first unit electrode 41 and the second unit electrode 42.

In the second embodiment, the contact region for realizing electrical conduction with the semiconductor substrate 2 is formed on a surface 2D of the semiconductor substrate 2, which differs from the surface 2U on which the first unit electrode 41 and the second unit electrode 42 are formed. That is, the contact region with the semiconductor substrate 2 is formed on the lower surface 2D of the semiconductor substrate 2. Thus, one electrode configured from the semiconductor substrate 2 can be formed using the surface 2D, which differs from the other electrodes, the first unit electrode 41 and the second unit electrode 42.

In the second embodiment, the first capacitor C1 is arranged between the first unit electrode 41 and the second unit electrode 42. That is, the first capacitor C1 functions as the X capacitor. It thereby becomes possible to carry out controls such as increasing the depths of the first unit electrode 41 and the second unit electrode 42, and such as increasing the number of parallels of the first unit electrode 41 and the second unit electrode 42. Thus, it is possible to increase the electrostatic capacitance of the first capacitor C1 by the controlling the depth, the number of parallels, etc., of the first unit electrode 41 and the second unit electrode 42.

In the second embodiment, the second capacitor C2 is formed between the first unit electrode 41 and the semiconductor substrate 2, and the third capacitor C3 is formed between the second unit electrode 42 and the semiconductor substrate 2. That is, the second capacitor C2 and the third capacitor C3 function as the Y capacitor. As a result, the bottom portions of the first trench T1 and the second trench T2 function as the second capacitor C2 and the third capacitor C3. Thus, although the electrostatic capacitance of the second capacitor C2 and of the third capacitor C3 is low, it is possible to suppress the leakage current correspondingly. The other actions are the same as those in the first embodiment, so that the descriptions thereof are omitted.

The effects are described next. The effects listed below can be obtained according to the semiconductor capacitor 1B of the second embodiment, in addition to the effects of (1) to (3) already described.

(4) One of the unit electrodes of the electrode group (the electrode group 4) is the semiconductor substrate (the semiconductor substrate 2) (FIG. 3). Therefore, it is possible to cause the areas between the semiconductor substrate (the semiconductor substrate 2) and the unit electrodes (the first unit electrode 41 and the second unit electrode 42) to function as capacitors (the second capacitor C2 and the third capacitor C3), in addition to the area between the unit electrodes (the first unit electrode 41 and the second unit electrode 42).

(5) The contact region for obtaining electrical conduction with the semiconductor substrate (the semiconductor substrate 2) is formed on a surface (the surface 2D) of the semiconductor substrate (the semiconductor substrate 2), which differs from the surface (the surface 2U) on which the unit electrodes (the first unit electrode 41 and the second unit electrode 42) are formed. Thus, the one electrode configured from the semiconductor substrate (the semiconductor substrate 2) can be formed using the surface (the surface 2D) that is different from the other unit electrodes (the first unit electrode 41 and the second unit electrode 42).

Third Embodiment

The third embodiment is an example in which the number of unit electrodes is increased from two to three, compared to the second embodiment.

Figure 9:
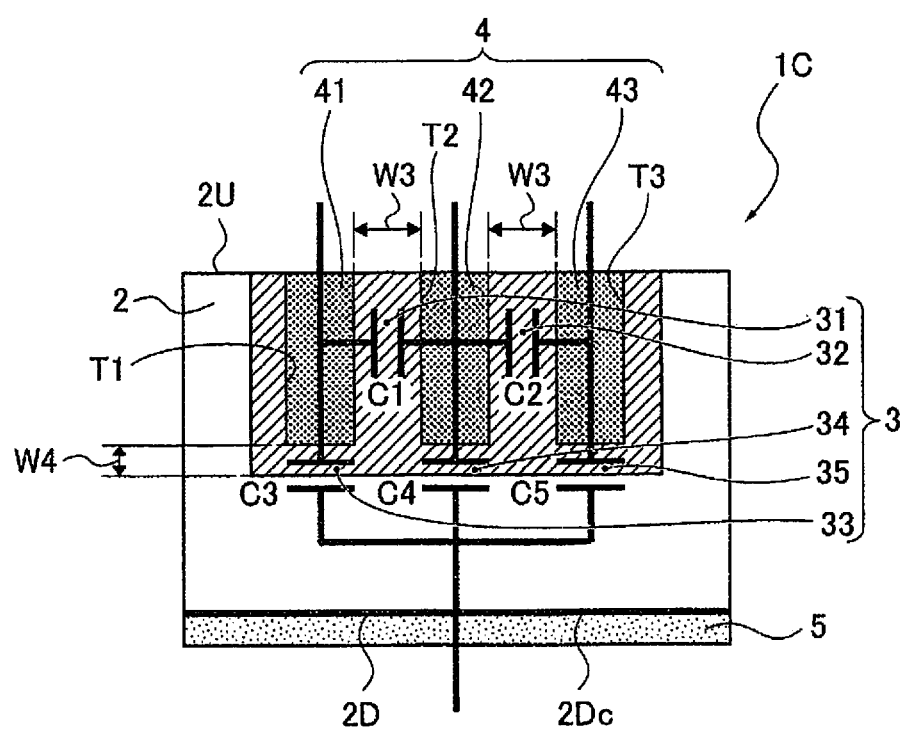
FIG. 9 is an explanatory expanded view illustrating the internal structure of the semiconductor capacitor in a third embodiment.

The configuration is described first. The semiconductor capacitor according to the third embodiment is applied to the XY capacitor, in the same manner as in the second embodiment. FIG. 9 illustrates the internal structure of the semiconductor capacitor in the third embodiment. The "overall configuration" and the "arrangement configuration" will be described separately below regarding the configuration of the semiconductor capacitor according to the third embodiment, based on FIG. 9. The "method for manufacturing the semiconductor capacitor" of the third embodiment is the same as that of the second embodiment, so the description thereof is omitted.

A semiconductor capacitor 1C comprises the semiconductor substrate 2 (for example, silicon), the insulators 3 (for example, silicon oxide), the electrode group 4 (for example, polycrystalline silicon), and the terminal electrode 5 (for example, aluminum).

The semiconductor substrate 2 serves as one of the unit electrodes of the electrode group. The first trench T1 (groove), the second trench T2 (groove), and the third trench T3 (groove) are formed on the upper surface 2U (front surface) of the semiconductor substrate 22. The first unit electrode 41 is formed in the first trench T1. The second unit electrode 42 is formed in the second trench T2. The third unit electrode 43 is formed in the third trench T3. The contact region 2Dc for obtaining electrical conduction with the semiconductor substrate 2 is formed on the lower surface 2D of the semiconductor substrate 2, which differs from the upper surface 2U on which the first unit electrode 41, the second unit electrode 42, and the third unit electrode 43 are formed. In FIG. 9, the contact region 2Dc is indicated by a bold line.

The insulators 3 include the first insulator 31, the second insulator 32, the third insulator 33, a fourth insulator 34, and a fifth insulator 35. The first insulator 31 is sandwiched between the first unit electrode 41 and the second unit electrode 42. The first insulator 31 serves as the dielectric of the first capacitor C1. The second insulator 32 is sandwiched between the second unit electrode 42 and the third unit electrode 43. The second insulator 32 serves as the dielectric of the second capacitor C2. The third insulator 33 is sandwiched between the first unit electrode 41 and the semiconductor substrate 2. The third insulator 33 serves as the dielectric of the third capacitor C3. The fourth insulator 34 is sandwiched between the second unit electrode 42 and the semiconductor substrate 2. The fourth insulator 34 serves as the dielectric of a fourth capacitor C4. The fifth insulator 35 is sandwiched between the third unit electrode 43 and the semiconductor substrate 2. The fifth insulator 35 serves as the dielectric of a fifth capacitor C5. The tolerance and/or the conductance is set to differ among the first capacitor C1, the second capacitor C2, the third capacitor C3, the fourth capacitor C4, and the fifth capacitor C5.

The electrode group 4 comprises the first unit electrode 41, the second unit electrode 42, and the third unit electrode 43. The first unit electrode 41 has the structure of a trench electrode that is embedded in the first trench T1. The second unit electrode 42 has the structure of a trench electrode that is embedded in the second trench T2. The third unit electrode 43 has the structure of a trench electrode that is embedded in the third trench T3.

The other configurations are the same as those in the second embodiment, so that the corresponding configurations have been assigned the same reference symbols and the descriptions thereof have been omitted.

The first capacitor C1 is arranged between the first unit electrode 41 and the second unit electrode 42. The second capacitor C2 is arranged between the second unit electrode 42 and the third unit electrode 43. The third capacitor C3 is arranged between the first unit electrode 41 and the semiconductor substrate 2. The fourth capacitor C4 is arranged between the second unit electrode 42 and the semiconductor substrate 2. The fifth capacitor C5 is arranged between the third unit electrode 43 and the semiconductor substrate 2.

The thicknesses of the first insulator 31 and the second insulator 32 are W3. The thicknesses of the third insulator 33, the fourth insulator 34, and the fifth insulator 35 are W4. The thickness W3 of the first insulator 31 and the second insulator 32 is greater than the thickness W4 of the third insulator 33, the fourth insulator 34, and the fifth insulator 35 (W4<W3). The thicknesses of the first insulator 31, the second insulator 32, the third insulator 33, the fourth insulator 34, and the fifth insulator 35 are proportional to the withstand voltages of the first capacitor C1, the second capacitor C2, the third capacitor C3, the fourth capacitor C4, and the fifth capacitor C5. That is, the voltage that can be applied for a specified period of time without causing dielectric breakdown is greater for the first capacitor C1 and the second capacitor C2, compared to that for the third capacitor C3, the fourth capacitor C4, and the fifth capacitor C5.

The actions are described next. In the third embodiment, one of the unit electrodes of the electrode group is the semiconductor substrate 2. That is, the semiconductor substrate 2 serves as one of the unit electrodes. Thus, the semiconductor substrate 2 is used as one electrode of the third capacitor C3, the fourth capacitor C4, and the fifth capacitor C5. In particular, when the semiconductor substrate 2 is a substrate having a relatively low resistance, the capacitor circuit can be configured with the semiconductor substrate 2 serving as a connection point. As a result, the third capacitor C3 can be formed between the first unit electrode 41 and the semiconductor substrate 2, and the fourth capacitor C4 can be formed between the second unit electrode 42 and the semiconductor substrate 2, in addition to which the fifth capacitor C5 can be formed between the third unit electrode 43 and the semiconductor substrate 2. Therefore, it is possible to cause the areas between the semiconductor substrate 2 and the first unit electrode 41, the second unit electrode 42, and the third unit electrode 43 to function as the third capacitor C3, the fourth capacitor C4, and the fifth capacitor C5, in addition to the areas between the first unit electrode 41, the second unit electrode 42, and the third unit electrode 43. In addition, by increasing the number of unit electrodes from two to three, it is possible to increase the number of capacitors that are arranged in the semiconductor capacitor 1C from three to five. Thus, compared to a case in which two unit electrodes are provided, it is possible to increase the overall capacitance of the semiconductor capacitor 1C.

In the third embodiment, the contact region 2Dc for obtaining electrical conduction with the semiconductor substrate 2 is formed on the surface 2D of the semiconductor substrate 2, which differs from the surface 2U on which the first unit electrode 41, the second unit electrode 42, and the third unit electrode 43 are formed. That is, the contact region 2Dc with the semiconductor substrate 2 is formed on the lower surface 2D of the semiconductor substrate 2. Thus, one electrode configured from the semiconductor substrate 2 can be formed using the surface 2D, which differs from the other electrodes, the first unit electrode 41, the second unit electrode 42, and the third unit electrode 43.

In the third embodiment, the first capacitor C1 is formed between the first unit electrode 41 and the second unit electrode 42, and the second capacitor C2 is formed between the second unit electrode 42 and the third unit electrode 43. That is, the first capacitor C1 and the second capacitor C2 function as the X capacitor that is connected to the power supply line. It thereby becomes possible to carry out controls such as increasing the depth of the first unit electrode 41, the second unit electrode 42, and the third unit electrode 43, and increasing the number of parallels of the first unit electrode 41, the second unit electrode 42, and the third unit electrode 43. Thus, it is possible to increase the electrostatic capacitance of the first capacitor C1 and of the second capacitor C2 in accordance with the control of the depth, the number of parallels, etc., of the first unit electrode 41, the second unit electrode 42, and the third unit electrode 43.

In the third embodiment, the third capacitor C3 is formed between the first unit electrode 41 and the semiconductor substrate 2, the fourth capacitor C4 is formed between the second unit electrode 42 and the semiconductor substrate 2, and the fifth capacitor C5 is formed between the third unit electrode 43 and the semiconductor substrate 2. That is, the third capacitor C3, the fourth capacitor C4, and the fifth capacitor C5 function as the Y capacitor that is connected to the power supply lines and the chassis ground. As a result, the bottom portions of the first trench T1, the second trench T2, and the third trench T3 function as the third capacitor C3, the fourth capacitor C4, and the fifth capacitor C5. Thus, although the electrostatic capacitances of the third capacitor C3, the fourth capacitor C4, and of the fifth capacitor C5 are low, it is possible to suppress the leakage current correspondingly. In addition, although the semiconductor capacitor in the first embodiment is applied to the lateral capacitor, the semiconductor capacitor in the third embodiment is applied to the XY capacitor. The other actions are the same as those in the first embodiment and the second embodiment, so that the descriptions thereof are omitted.

The effects are described next. The same effects as those of (1) to (3) of the first embodiment as well as those of (4) and (5) of the second embodiment can be obtained according to the semiconductor capacitor 1C of the third embodiment.

Fourth Embodiment

The fourth embodiment is an example in which each terminal electrode is arranged as two electrode groups.

Figure 10:
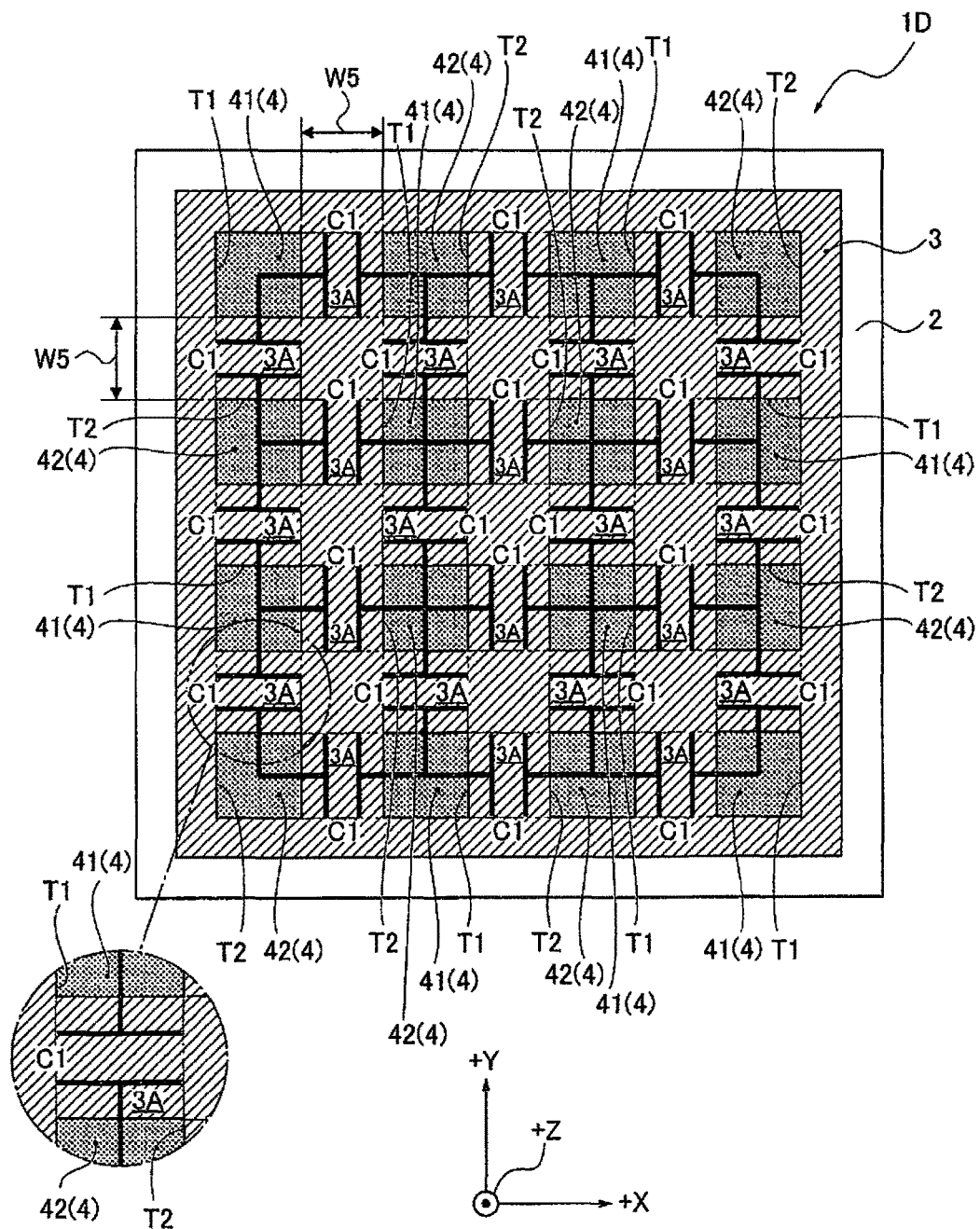
FIG. 10 is a plan view illustrating the planar structure of the semiconductor capacitor in a fourth embodiment.

The configuration is described first. The semiconductor capacitor according to the fourth embodiment is applied to the XY capacitor, in the same manner as in the second embodiment. FIG. 10 illustrates the planar structure of the semiconductor capacitor in the fourth embodiment. The "overall configuration" and the "arrangement configuration" will be described separately below regarding the configuration of the semiconductor capacitor according to the fourth embodiment, based on FIG. 10. The "method for manufacturing the semiconductor capacitor" of the fourth embodiment is the same as that of the second embodiment, so that the description thereof is omitted.

A semiconductor capacitor 1D comprises the semiconductor substrate 2 (for example, silicon), the insulator 3 (for example, silicon oxide), the electrode groups 4 (for example, polycrystalline silicon), and terminal electrodes (not shown).

The semiconductor substrate 2 serves as one of the unit electrodes of the electrode groups. The first trenches T1 (groove) and the second trenches T2 (groove) are formed on the upper surface 2U (front surface) of the semiconductor substrate 2. The first trenches T1 and the second trenches T2 have an outer shape that is rectangular in a plan view. The first unit electrodes 41 are formed in the first trenches T1. The second unit electrodes 42 are formed in the second trenches T2. The contact region (not shown) for obtaining electrical conduction with the semiconductor substrate 2 is formed on the lower surface (not shown) of the semiconductor substrate 2, which differs from the upper surface 2U on which the first unit electrodes 41 and the second unit electrodes 42 are formed.

The insulator 3 has regions 3A. The regions 3A are the regions sandwiched between the first unit electrodes 41 and the second unit electrodes 42. That is, the regions 3A are the regions in which the first unit electrodes 41 and the second unit electrodes 42 are opposing each other. The regions 3A serve as the dielectrics of the first capacitors C1. The tolerance and/or the conductance of the first capacitors C1 is set to differ in relation to the second capacitors C2 (not shown) and the third capacitors C3 (not shown), as described further below.

The electrode groups 4 comprise two electrode groups. One of the electrode groups comprises a plurality of the first unit electrodes 41. The other electrode group comprises a plurality of the second unit electrodes 42. The first unit electrodes 41 and the second unit electrodes 42 have an outer shape that is rectangular in a plan view. The first unit electrodes 41 have the structure of trench electrodes that are embedded in the first trenches T1. The second unit electrodes 42 have the structure of trench electrodes that are embedded in the second trenches T2. The other configurations are the same as those in the second embodiment, so that the corresponding configurations have been assigned the same reference symbols and the descriptions thereof have been omitted.

The first trenches T1 and the second trenches T2 are arranged in a lattice pattern in the XY direction with a constant thickness W3. The first trenches T1 and the second trenches T2 are arranged in four rows with respect to the XY direction. The first trenches T1 and the second trenches T2 are arranged in an alternately adjacent staggered pattern with respect to the XY direction. The first unit electrodes 41 and the second unit electrodes 42 are arranged in a lattice pattern in the XY direction with a constant thickness W5. The first unit electrodes 41 and the second unit electrodes 42 are arranged in four rows with respect to the XY direction. The first unit electrodes 41 and the second unit electrodes 42 are arranged in an alternately adjacent staggered pattern with respect to the XY direction.

The regions 3A are formed between the first unit electrodes 41 and the second unit electrodes 42. The first capacitors C1 are formed in the regions 3A. The first capacitors C1 function as the X capacitor that is connected to the power supply lines. The first capacitors C1 are arranged in seven rows with respect to the XY direction. The first capacitors C1 are arranged in an alternately adjacent staggered pattern with respect to the XY direction. The first capacitors C1 are connected in parallel.

Although not shown in FIG. 10, a plurality of the second capacitors C2 (not shown) are formed between the plurality of the first unit electrodes 41 and the semiconductor substrate 2. A plurality of the third capacitors C3 (not shown) are formed between the plurality of the second unit electrodes 42 and the semiconductor substrate 2. The plurality of the second capacitors C2 (not shown) and the plurality of the third capacitors C3 (not shown) function as the Y capacitor that is connected to the power supply line and the chassis ground.

The thicknesses of the regions 3A of the insulator 3 in the X and Y directions are W5. The thickness W5 of the regions 3A is proportional to the withstand voltage of the first capacitors C1.

The actions are described next. In the fourth embodiment, the electrode groups 4 include an electrode group comprising a plurality of the first unit electrodes 41, and an electrode group comprising a plurality of the second unit electrodes 42. That is, the first unit electrodes 41 and the second unit electrodes 42 are arranged in an alternately adjacent staggered pattern. A plurality of the first capacitors C1 are arranged between the plurality of the first unit electrodes 41 and the plurality of the second unit electrodes 42. That is, the first capacitors C1 are connected in parallel. Thus, it becomes possible to increase the electrostatic capacitance of the capacitors between the first unit electrodes 41 and the second unit electrodes 42. The other actions are the same as those in the first embodiment and the second embodiment, so that the descriptions thereof are omitted.

The effects are described next. The same effects as those of (1) to (3) of the first embodiment as well as those of (4) and (5) of the second embodiment can be obtained according to the semiconductor capacitor 1D of the fourth embodiment.

Fifth Embodiment

The fifth embodiment is an example in which the contact region is formed on the same surface of the semiconductor substrate as the surface on which the unit electrodes are formed.

Figure 11:
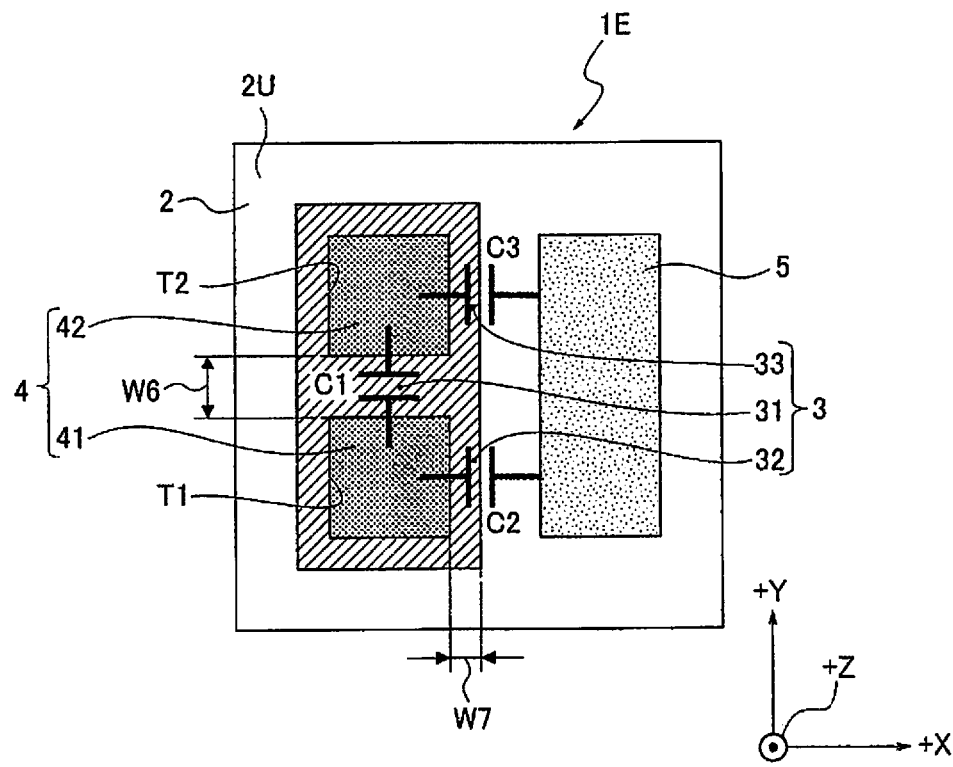
FIG. 11 is a plan view illustrating the planar structure of the semiconductor capacitor in a fifth embodiment.
Figure 12:
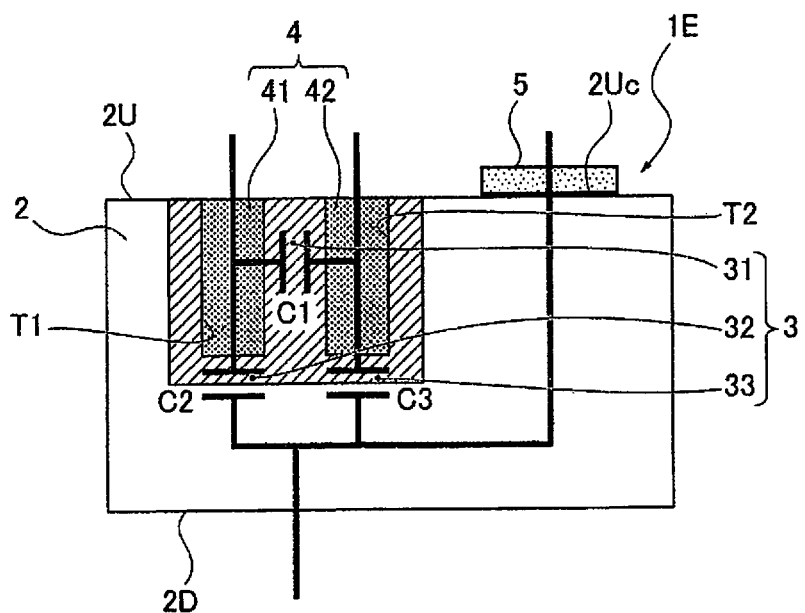
FIG. 12 is an explanatory expanded view illustrating the internal structure of the semiconductor capacitor in a fifth embodiment.

The configuration is described first. The semiconductor capacitor according to the fifth embodiment is applied to the XY capacitor, in the same manner as in the second embodiment. FIG. 11 illustrates the planar structure of the semiconductor capacitor in the fifth embodiment, and FIG. 12 shows the internal structure. The "overall configuration" and the "arrangement configuration" will be described separately below regarding the configuration of the semiconductor capacitor according to the fifth embodiment, based on FIGS. 11 and 12. The "method for manufacturing the semiconductor capacitor" of the fifth embodiment is the same as that of the second embodiment, so that the description thereof is omitted.

As shown in FIGS. 11 and 12, a semiconductor capacitor 1E comprises the semiconductor substrate 2 (for example, silicon), the insulators 3 (for example, silicon oxide), the electrode group 4 (for example, polycrystalline silicon), and the terminal electrode 5 (for example, aluminum). The semiconductor capacitor 1E has the lateral capacitor structure.

The semiconductor substrate 2 serves as one of the unit electrodes of the electrode group, as shown in FIG. 12. The first trench T1 (groove) and the second trench T2 (groove) are formed on the upper surface 2U (front surface) of the semiconductor substrate 2, as shown in FIGS. 11 and 12. The first unit electrode 41 is formed in the first trench T1, as shown in FIGS. 11 and 12. The second unit electrode 42 is formed in the second trench T2, as shown in FIGS. 11 and 12. A contact region 2Uc for realizing electrical conduction with the semiconductor substrate 2 is formed on the same surface of the semiconductor substrate 2 as the upper surface 2U on which the first unit electrode 41 and the second unit electrode 42 are formed, as shown in FIG. 12. In FIG. 12, the contact region 2Uc is indicated by a bold line.

The insulators 3 include the first insulator 31, the second insulator 32, and the third insulator 33, as shown in FIGS. 11 and 12. The first insulator 31 is sandwiched between the first unit electrode 41 and the second unit electrode 42, as shown in FIG. 12. The first insulator 31 serves as the dielectric of the first capacitor C1, as shown in FIG. 12. The second insulator 32 is sandwiched between the first unit electrode 41 and the semiconductor substrate 2, as shown in FIG. 12. The second insulator 32 serves as the dielectric of the second capacitor C2, as shown in FIG. 12. The third insulator 33 is sandwiched between the second unit electrode 42 and the semiconductor substrate 2, as shown in FIG. 12. The third insulator 33 serves as the dielectric of the third capacitor C3, as shown in FIG. 12. The tolerance and/or the conductance is set to differ among the first capacitor C1, the second capacitor C2, and the third capacitor C3, shown in FIG. 12.

The electrode group 4 comprises the first unit electrode 41 and the second unit electrode 42, as shown in FIGS. 11 and 12. The first unit electrode 41 has the structure of a trench electrode that is embedded in the first trench T1, as shown in FIG. 12. The second unit electrode 42 has the structure of a trench electrode that is embedded in the second trench T2, as shown in FIG. 12.

The terminal electrode 5 is formed on the upper surface 2U of the semiconductor substrate 2 via a contact region 2Uc, as shown in FIG. 12.

The first capacitor C1 is arranged between the first unit electrode 41 and the second unit electrode 42, as shown in FIG. 12. The second capacitor C2 is arranged between the first unit electrode 41 and the semiconductor substrate 2, as shown in FIG. 12. The third capacitor C3 is arranged between the second unit electrode 42 and the semiconductor substrate 2, as shown in FIG. 12.

The thickness of the first insulator 31 is W6, as shown in FIG. 11. The thicknesses of the second insulator 32 and the third insulator 33 are W7, as shown in FIG. 11. The thickness W6 of the first insulator 31 is greater than the thickness W7 of the second insulator 32 and the third insulator 33 (W7<W6), as shown in FIG. 11. The thicknesses of the first insulator 31, the second insulator 32, and the third insulator 33 are proportional to the withstand voltages of the first capacitor C1, the second capacitor C2, and the third capacitor C3, as shown in FIG. 11. That is, the voltage that can be applied for a specified period of time without causing dielectric breakdown is greater for the first capacitor C1 compared to that for the second capacitor C2 and the third capacitor C3, as shown in FIG. 11.

The actions are described next. In the fifth embodiment, the contact region 2Uc for realizing electrical conduction with the semiconductor substrate 2 is formed on the same surface of the semiconductor substrate 2 as the surface 2U on which the first unit electrode 41 and the second unit electrode 42 are formed. That is, the contact region 2Uc is provided on the same surface as the surface 2U on which the first unit electrode 41 and the second unit electrode 42 are formed. As a result, the semiconductor substrate 2, as an electrode, can be connected to the electrodes other than the semiconductor substrate 2, that is, the first unit electrode 41 and the second unit electrode 42, on the upper surface 2U side of the semiconductor substrate 2. Thus, an electrical connection between the first unit electrode 41 and the second unit electrode 42, and electrical connections to the semiconductor substrate 2 can be carried out on the same surface 2U of the semiconductor substrate 2. The other actions are the same as those in the first embodiment and the second embodiment; the descriptions thereof have therefore been omitted.

The effects are described next. The effects listed below can be obtained according to the semiconductor capacitor 1E of the fifth embodiment, in addition to the effects of (1) to (4) described above.

(6) The contact region for obtaining electrical conduction with the semiconductor substrate (the semiconductor substrate 2) is formed on the same surface of the semiconductor substrate (the semiconductor substrate 2) as the surface (the surface 2U) on which the unit electrodes (the first unit electrode 41 and the second unit electrode 42) are formed. Thus, the electrical connection between the unit electrodes (the first unit electrode 41 and the second unit electrode 42), and the electrical connections to the semiconductor substrate (the semiconductor substrate 2) can be carried out on the same surface (the surface 2U) of the semiconductor substrate (the semiconductor substrate 2).

Sixth Embodiment

The sixth embodiment is an example in which the contact regions are formed in regions surrounded by the unit electrodes.

Figure 13:
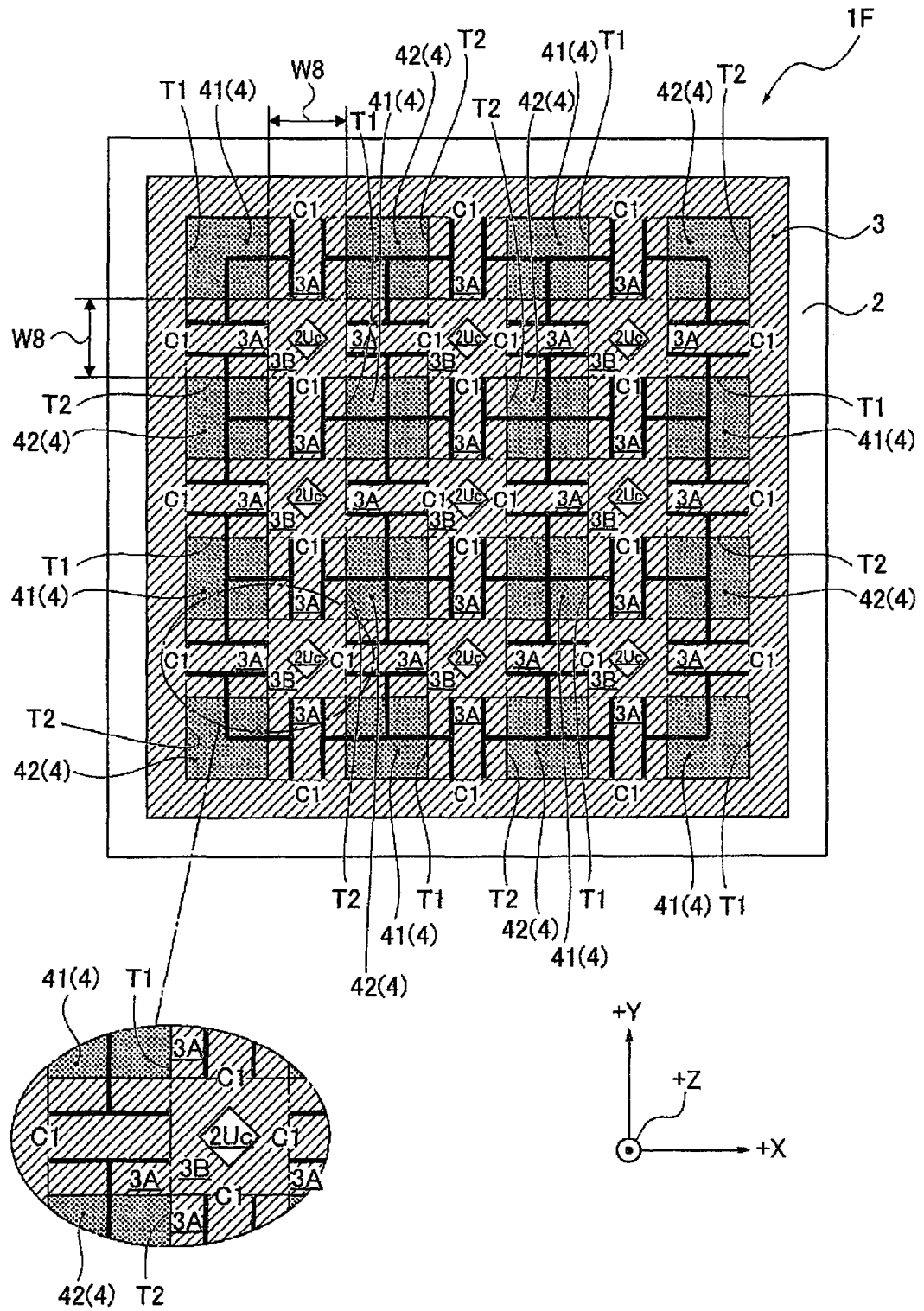
FIG. 13 is a plan view illustrating the planar structure of the semiconductor capacitor in a sixth embodiment.
Figure 14:
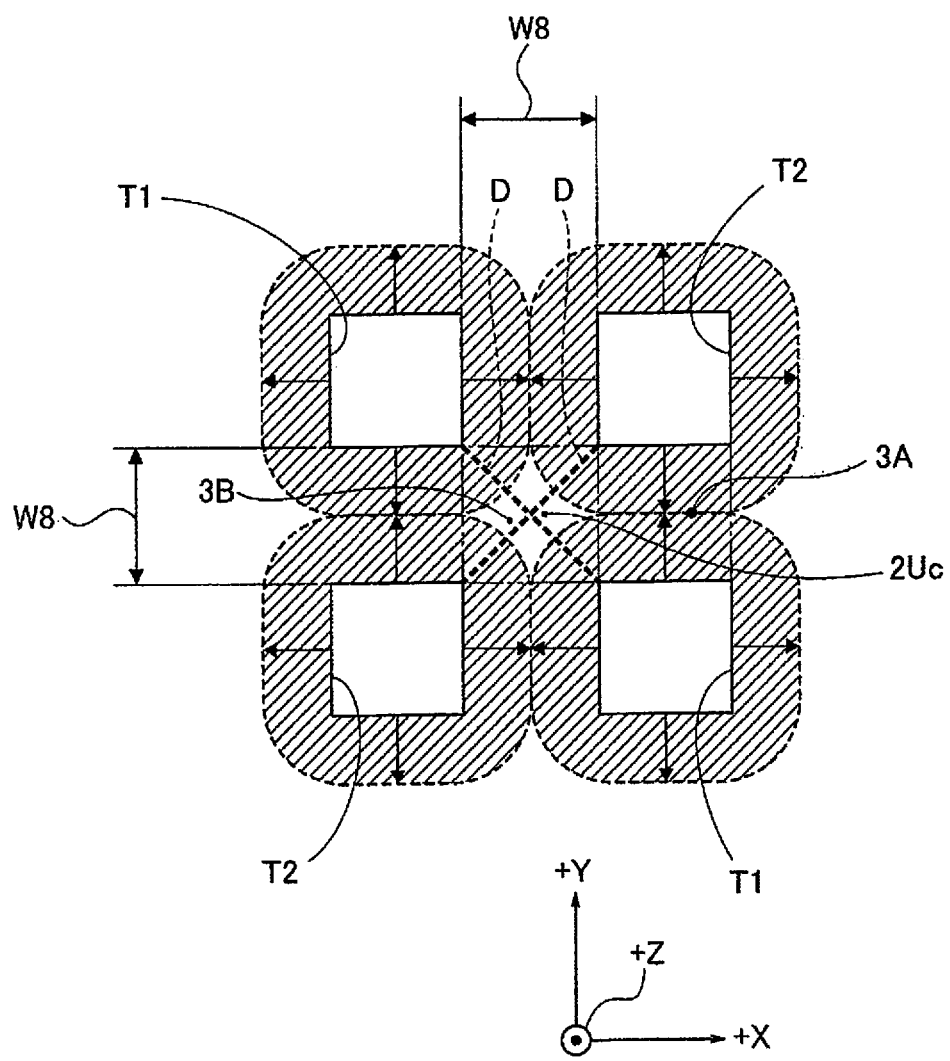
FIG. 14 is a plan view illustrating the arrangement structure of the semiconductor capacitor in the sixth embodiment.

The configuration is described first. The semiconductor capacitor according to the sixth embodiment is applied to the XY capacitor, in the same manner as in the second embodiment. FIG. 13 illustrates the planar structure of the semiconductor capacitor in the sixth embodiment, and FIG. 14 shows the arrangement structure. The "overall configuration" and the "arrangement configuration" will be described separately below regarding the configuration of the semiconductor capacitor according to the sixth embodiment, based on FIGS. 13 and 14. The "method for manufacturing the semiconductor capacitor" in the sixth embodiment is the same as that in the second embodiment, so that the description thereof is omitted.

A semiconductor capacitor 1F comprises the semiconductor substrate 2 (for example, silicon), the insulator 3 (for example, silicon oxide), and the electrode group 4 (for example, polycrystalline silicon), as shown in FIG. 13. The semiconductor capacitor 1F has the lateral capacitor structure.

The semiconductor substrate 2 becomes one of the unit electrodes of the electrode group, as shown in FIG. 13. The first trenches T1 (groove) and the second trenches T2 (groove) are formed on the upper surface 2U (front surface) of the semiconductor substrate 2, as shown in FIG. 13. The first trenches T1 and the second trenches T2 have an outer shape that is rectangular in a plan view, as shown in FIG. 13. The first unit electrodes 41 are formed in the first trenches T1, as shown in FIG. 13. The second unit electrodes 42 are formed in the second trenches T2, as shown in FIG. 13. The contact region 2Uc for realizing electrical conduction with the semiconductor substrate 2 is formed on the same surface of the semiconductor substrate 2 as the upper surface 2U on which the first unit electrodes 41 and the second unit electrodes 42 are formed, as shown in FIG. 13.

The insulator 3 has regions 3A and regions 3B, as shown in FIG. 13. The regions 3A are sandwiched between the first trenches T1 and the second trenches T2, as shown in FIGS. 13 and 14. That is, the regions 3A are where the first trenches T1 and the second trenches T2 are opposing, as shown in FIGS. 13 and 14. The regions 3A serve as the dielectrics of the first capacitors C1, as shown in FIG. 13. The regions 3B are regions surrounded by the first trenches T1 and the second trenches T2, as shown in FIGS. 13 and 14. That is, the regions 3B are where the first trenches T1 and the second trenches T2 are not opposing, as shown in FIGS. 13 and 14. The tolerance and/or the conductance is set to differ among the first capacitors C1, in relation to the second capacitors C2 (not shown) and the third capacitors C3 (not shown), described further below.

The electrode groups 4 comprise two electrode groups, as shown in FIG. 13. One of the electrode groups comprises a plurality of the first unit electrodes 41, as shown in FIG. 13. The other electrode group comprises a plurality of the second unit electrodes 42, as shown in FIG. 13. The first unit electrodes 41 and the second unit electrodes 42 have an outer shape that is rectangular in a plan view, as shown in FIG. 13. The first unit electrodes 41 have the structure of trench electrodes that are embedded in the first trenches T1, as shown in FIG. 13. The second unit electrode 42 have the structure of trench electrodes that are embedded in the second trenches T2, as shown in FIG. 13.

The first trenches T1 and the second trenches T2 are arranged in a lattice pattern in the XY direction with a constant thickness W8, as shown in FIG. 13. The first trenches T1 and the second trenches T2 are arranged in four rows with respect to the XY direction, as shown in FIG. 13. The first trenches T1 and the second trenches T2 are arranged in an alternately adjacent staggered pattern with respect to the XY direction, as shown in FIG. 13. The first unit electrodes 41 and the second unit electrodes 42 are arranged in a lattice pattern in the XY direction with a constant thickness W8, as shown in FIG. 13. The first unit electrodes 41 and the second unit electrodes 42 are arranged in four rows with respect to the XY direction, as shown in FIG. 13. The first unit electrodes 41 and the second unit electrodes 42 are arranged in an alternately adjacent staggered pattern with respect to the XY direction, as shown in FIG. 13.

The regions 3A are arranged between the first unit electrodes 41 and the second unit electrodes 42, as shown in FIG. 13. The first capacitors C1 are formed in the regions 3A, as shown in FIG. 13. The first capacitors C1 function as the X capacitor that is connected to the power supply lines, as shown in FIG. 13. The first capacitors C1 are arranged in seven rows with respect to the XY direction, as shown in FIG. 13. The first capacitors C1 are arranged in an alternately adjacent staggered pattern with respect to the XY direction, as shown in FIG. 13. The first capacitors C1 are connected in parallel, as shown in FIG. 13.

Although not shown in FIG. 13, a plurality of the second capacitors C2 (not shown) are formed between the plurality of the first unit electrodes 41 and the semiconductor substrate 2. A plurality of the third capacitors C3 (not shown) are formed between the plurality of the second unit electrodes 42 and the semiconductor substrate 2. The plurality of the second capacitors C2 (not shown) and the plurality of the third capacitors C3 (not shown) function as the Y capacitor that is connected to the power supply line and the chassis ground.

The thicknesses of the regions 3A of the insulator 3 in the X and Y directions are W8, as shown in FIG. 14. For example, in the case that the width W8 (the oxide film thickness between the first trenches T1 and the second trenches T2) is required to be one micron, and if the oxide film that is formed by means of thermal oxidation is twice the thickness between the trenches before oxidation, the original thickness between the trenches may be set to 0.5 microns. The thickness W8 of the regions 3A is proportional to the withstand voltage of the first capacitors C1, as shown in FIG. 13.

A pair of the first trenches T1 and a pair of the second trenches T2 are arranged in a staggered pattern with respect to the XY direction, as shown in FIG. 14. The region 3B of the insulator 3 is surrounded by the pair of the first trenches T1 and the pair of the second trenches T2, as shown in FIG. 14. When the side walls of the first trenches T1 and the second trenches T2 are oxidized in the X and Y directions (the directions of the arrows in the drawing) by means of thermal oxidation, a portion of the region 3B is not oxidized, as shown in FIG. 14. That is, the portion of the region 3B remains as the contact region 2Uc of the semiconductor substrate 2, as shown in FIG. 14.

The region 3B is disposed at a position where the pair of the first trenches T1 face each other on a diagonal line D, as shown in FIG. 14. The region 3B is disposed at a position where the pair of the second trenches T2 are opposing on a diagonal line D, as shown in FIG. 14. The length of the diagonal lines D in the region 3B is inversely proportional to the electrostatic capacitance of the capacitor that is formed in the region 3B, as shown in FIG. 14. The thickness W8 of the regions 3A is inversely proportional to the electrostatic capacitance of the capacitors that are formed in the regions 3A, as shown in FIG. 14. The diagonal lines D are longer than the thickness W8 (D>W8), as shown in FIG. 14. That is, the electrostatic capacitance of the capacitor that is formed in the region 3B is less than the electrostatic capacitance of the capacitors C1 that are formed in the regions 3A. Here, "diagonal lines D" refer to the line segments that connect the opposing corners of the pairs of the first and second trenches T1, T2 to each other and that are indicated by the broken lines, as shown in FIG. 14.

The actions are described next. In the sixth embodiment, the contact regions 2Uc are formed in the regions 3B that are surrounded by the first unit electrodes 41 and the second unit electrodes 42. That is, the contact regions 2Uc are formed in the regions 3B where the first unit electrodes 41 and the second unit electrodes 42 are not opposing. Thus, the contact regions 2Uc are formed in the regions 3B, where the electrostatic capacitance of the capacitors becomes smaller than in the regions 3A, where the first unit electrodes 41 and the second unit electrodes 42 are opposing. That is, the contact regions 2Uc are formed in the regions 3B, where the capacitors do not effectively function compared to the regions 3A. The first unit electrode 41 and the second unit electrode 42 are not present in the regions 3B. Therefore, the area of the upper surface 2U of the semiconductor substrate 2 can be effectively utilized, compared to a case in which the contact regions 2Uc are formed in regions other than the regions 3B of the upper surface 2U of the semiconductor substrate 2. Thus, the contact regions 2Uc can be formed from the semiconductor substrate 2 without sacrificing the electrostatic capacitance of the semiconductor capacitor 1F. The other actions are the same as those in the first embodiment, the second embodiment, and the fifth embodiment, so that the descriptions thereof are omitted.

The effects are described next. The effects listed below can be obtained according to the semiconductor capacitor 1F of the sixth embodiment, in addition to the effects of (1) to (4) and (6) already described.

(7) The contact regions (the contact regions 2Uc) are formed in the regions (the regions 3B) that are surrounded by the unit electrodes (the first unit electrodes 41 and the second unit electrodes 42). Thus, the contact regions (the contact regions 2Uc) can be formed from the semiconductor substrate (the semiconductor substrate 2) without sacrificing the electrostatic capacitance of the semiconductor capacitor (the semiconductor capacitor 1F).

The semiconductor capacitor of the present invention was described above based on the first to the sixth embodiments, but specific configurations thereof are not limited to these embodiments, and various modifications and additions to the design can be made without departing from the scope of the invention according to each claim in the Claims.

Figure 15:
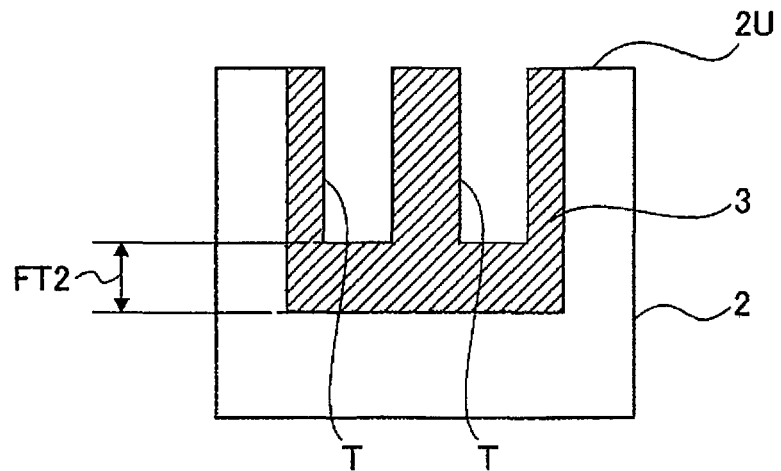
FIG. 15 is a cross-sectional view illustrating a modified example of the insulating film forming process of the method for manufacturing the semiconductor capacitor in the second embodiment.
Figure 16:
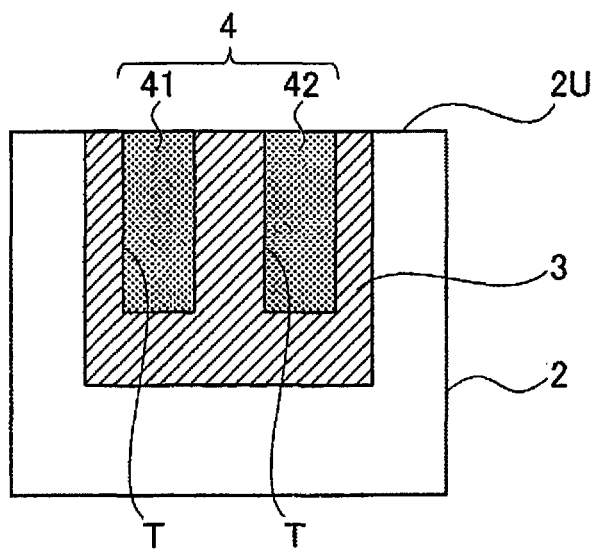
FIG. 16 is a cross-sectional view illustrating a modified example of the electrode group forming process of the method for manufacturing the semiconductor capacitor in the second embodiment.

In the second embodiment, an example was shown in which the semiconductor capacitor 1B is manufactured by carrying out the trench forming process (FIGS. 5 and 6), the insulating film forming process (FIG. 7), and the electrode group forming process (FIG. 8), in that order. However, the invention is not limited in this way. For example, the time for the thermal oxidation step in the insulating film forming process may be made longer than that of the insulating film forming process (FIG. 7), as shown in FIGS. 15 and 16. The trench forming process is the same as that of FIGS. 5 and 6; therefore, an illustration thereof is omitted. In the insulator forming process, first, there is a thermal oxidation step in which the semiconductor substrate 2 that is cleaned in the substrate cleaning step is placed in the oxidation furnace and heat is applied in an oxygen atmosphere, but an illustration thereof is omitted. The time for this thermal oxidation step is set to be longer than the time for the thermal oxidation step included in the insulating film forming process (FIG. 7). Subsequently, the upper surface 2U of the semiconductor substrate 2 is exposed by means of the insulator removal step in which portions of the insulator 3 are removed, as shown in FIG. 15. The insulator forming process is thereby completed. In the electrode group forming process, the first unit electrode 41 and the second unit electrode 42, similar to those of FIG. 8, are formed in the respective trenches T, as shown in FIG. 16. Subsequently, the upper surface 2U of the semiconductor substrate 2 is exposed by means of the electrode material removal step in which portions of the electrode material are removed, as shown in FIG. 16. The electrode group forming process is thereby completed. That is, thermal oxidation is continued even after the area between the trenches T is oxidized. As a result, the oxide film thickness FT2 of the insulator 3 that is formed at the bottom portion of the trenches T is made thicker than the oxide film thickness FT1 (FIG. 7) (FT2>FT1), as shown in FIG. 15. Thus, it is possible to increase the withstand voltages of the capacitors that are formed between the semiconductor substrate 2 and each of the trenches T, as well as to suppress the leakage current between the semiconductor substrate 2 and each of the trenches T.

In the second embodiment, an example was shown in which the insulating film is formed on the semiconductor substrate by means of the thermal oxidation treatment, in which the semiconductor substrate 2 is placed in the oxidation furnace (not shown) and heat is applied in an oxygen atmosphere. However, the invention is not limited in this way. For example, the insulating film may be formed on the semiconductor substrate by using the CVD method.

In the second embodiment, the third embodiment, and the fifth embodiment, examples were shown in which the terminal electrode 5 is made of aluminum. However, the invention is not limited in this way. For example, the terminal electrode 5 may be made of Ti (titanium)/Ni (nickel)/Ag (silver).

In the second to the sixth embodiments, examples were shown in which the semiconductor capacitor of the present invention is applied to the XY capacitor, which is used for suppressing electromagnetic noise. However, the semiconductor capacitor of the present invention can be applied to capacitors used in inverters (for example, smoothing capacitors) mounted in vehicles such as electric vehicles or hybrid vehicles, or for other industrial applications besides those of vehicles (for example, ships).

The invention claimed is:

1. A semiconductor capacitor comprising:
   a semiconductor substrate,
   an electrode group formed on the semiconductor substrate, and a plurality of insulators, in which a plurality of capacitors are formed having a structure in which the insulators are sandwiched between the electrode groups, at least one of the plurality of capacitors being set to be different in at least one of a tolerance, which is a capability of the capacitors to withstand a prescribed voltage, and a conductance, which is an ease with which a leakage current flows in the capacitors.

2. The semiconductor capacitor according to claim 1, wherein the electrode group including a plurality of unit electrodes that each has a structure of a trench electrode that is embedded in a groove that is formed on a front surface of the semiconductor substrate.

3. The semiconductor capacitor according to claim 1, wherein the electrode group including a plurality of unit electrodes one of the unit electrodes of the electrode group is the semiconductor substrate.

4. The semiconductor capacitor according to claim 3, wherein a contact region for obtaining electrical conduction with the semiconductor substrate is formed on a surface of the semiconductor substrate on which the unit electrodes are formed.

5. The semiconductor capacitor according to claim 4, wherein the contact region is formed in a region surrounded by the unit electrodes.

6. The semiconductor capacitor according to claim 3, wherein a contact region for obtaining electrical conduction with the semiconductor substrate is formed on a surface of the semiconductor substrate that differs from a surface on which the unit electrodes are formed.

7. The semiconductor capacitor according to claim 2, wherein a thickness between the unit electrodes is proportional to a withstand voltage of the capacitor that is formed between the unit electrodes.

8. The semiconductor capacitor according to claim 2, wherein the electrode group including a plurality of unit electrodes one of the unit electrodes of the electrode group is the semiconductor substrate.

9. The semiconductor capacitor according to claim 3, wherein a contact region for obtaining electrical conduction with the semiconductor substrate is formed on a surface of the semiconductor substrate on which the unit electrodes are formed.

10. The semiconductor capacitor according to claim 4, wherein the contact region is formed in a region surrounded by the unit electrodes.

11. The semiconductor capacitor according to claim 3, wherein a contact region for obtaining electrical conduction with the semiconductor substrate is formed on a surface of the semiconductor substrate that differs from a surface on which the unit electrodes are formed.

12. The semiconductor capacitor according to claim 3, wherein a thickness between the unit electrodes is proportional to a withstand voltage of the capacitor that is formed between the unit electrodes.

13. The semiconductor capacitor according to claim 4, wherein a thickness between the unit electrodes is proportional to a withstand voltage of the capacitor that is formed between the unit electrodes.

14. The semiconductor capacitor according to claim 5, wherein a thickness between the unit electrodes is proportional to a withstand voltage of the capacitor that is formed between the unit electrodes.

15. The semiconductor capacitor according to claim 6, wherein a thickness between the unit electrodes is proportional to a withstand voltage of the capacitor that is formed between the unit electrodes.

* * * * *